United States Patent
Chen et al.

(10) Patent No.: US 8,594,975 B2
(45) Date of Patent: Nov. 26, 2013

(54) SYSTEMS AND METHODS FOR WAFER EDGE FEATURE DETECTION AND QUANTIFICATION

(75) Inventors: Haiguang Chen, Mountain View, CA (US); Jaydeep Sinha, Livermore, CA (US)

(73) Assignee: KLA-Tencor Corporation, Milpitas, CA (US)

(*) Notice: Subject to any disclaimer, the term of this patent is extended or adjusted under 35 U.S.C. 154(b) by 279 days.

(21) Appl. No.: 13/028,074

(22) Filed: Feb. 15, 2011

(65) Prior Publication Data
US 2011/0218762 A1 Sep. 8, 2011

Related U.S. Application Data

(60) Provisional application No. 61/310,704, filed on Mar. 4, 2010.

(51) Int. Cl.
*G01B 3/22* (2006.01)

(52) U.S. Cl.
USPC .............................. 702/167; 702/36; 702/185

(58) Field of Classification Search
USPC .............. 702/36, 96, 150, 155, 167, 170, 185
See application file for complete search history.

(56) References Cited

U.S. PATENT DOCUMENTS

| 5,952,667 A * | 9/1999 | Shimizu ..................... 250/492.2 |
| 5,973,777 A | 10/1999 | Nonoto |
| 8,144,337 B2 * | 3/2012 | Hamamatsu et al. ......... 356/600 |
| 2003/0023402 A1 | 1/2003 | Kobayashi |
| 2008/0008396 A1 * | 1/2008 | Kisilev et al. ................. 382/272 |
| 2008/0262751 A1 * | 10/2008 | Fettig et al. .................... 702/36 |

FOREIGN PATENT DOCUMENTS

JP    2009-278035 A1    11/2009

* cited by examiner

*Primary Examiner* — Marc Armand
*Assistant Examiner* — Ivan Rabovianski
(74) *Attorney, Agent, or Firm* — Suiter Swantz pc llo (57) ABSTRACT

Disclosed herein is a method to enhance detection and quantification of features in the wafer edge/wafer roll off regions. Modifications and improvements have been made to earlier methods which enable improved accuracy and increased scope of feature detection.

14 Claims, 10 Drawing Sheets

SYSTEMS AND METHODS FOR WAFER EDGE FEATURE DETECTION AND QUANTIFICATION

CROSS REFERENCE TO RELATED APPLICATION

This application is related to U.S. Provisional Application No. 61/310,704, filed Mar. 4, 2010, and claims priority therefrom. This application is also related to commonly owned U.S. Pat. No. 7,853,429, issued Dec. 14, 2010. Application No. 61/310,704 and U.S. Pat. No. 7,853,429 are hereby incorporated by reference in their entireties.

FIELD OF THE INVENTION

This invention relates to metrology of semiconductor wafers, and in particular to methods for improving detection and quantification of features in the wafer edge and wafer roll off regions.

BACKGROUND

As integrated circuits become faster and denser, requirements for control of topographical features such as planarity, shape, and thickness become increasingly stringent. The necessity for verifying that a given wafer is sufficiently planar and within specifications, i.e. in qualifying and selecting wafers even before processing begins or during processing, is becoming ever greater. A critical component in the characterization of wafers is the wafer topography, sometimes termed substrate geometry. In particular it is necessary to characterize the surface profile in order to determine whether there is perturbation of the profile to the extent that would prevent the wafer from being processed into a finished product. This characterization is particularly critical in the edge regions of semiconductor wafers, where there is generally a slope roll off. In these regions traditional thickness measurements are unlikely to effectively and accurately reveal and characterize such perturbations. Present techniques utilize wafer front & back surface and thickness measurements, which are processed to provide a curvature profile by taking the second derivative of the data curve.

SUMMARY OF THE INVENTION

Disclosed herein is a method to enhance detection and quantification of features in the wafer edge/wafer roll off regions. Modifications and improvements have been made to the methods disclosed in U.S. Pat. No. 7,853,429 which enable improved accuracy and increased scope of feature detection.

DETAILED DESCRIPTION

A prior method of quantifying and evaluating the shape of a semiconductor wafer is disclosed by Sato et al in U.S. Pat. No. 7,209,857, issued Apr. 24, 2007. The specification of this patent is incorporated herein by reference.

Previously incorporated U.S. Pat. No. 7,853,429 discloses a method for detecting anomalies in the wafer edge/wafer roll off region which includes obtaining the second derivative curve of the front surface, back surface, and thickness profile curve. It also discloses a method for additional signal processing which allows or provides the values of feature start point, peak point, and distance there between. Also disclosed is the use of polar coordinates to characterize the wafer edge region, as contrasted to the Cartesian coordinate characterization of the wafer regions not at the wafer edge. Standard measurement of wafer surfaces is described in SEMI-M49-0307, "Guide for specifying geometry measurement systems for silicon wafers for the 130 nm to 22 nm technology generations," 2010. Polar coordinates $Z(r, \theta)$ are often used to conveniently and accurately describe the profile variation for a wafer edge profile. Disclosed herein are methods which extend and enhance the methods disclosed in U.S. Pat. No. 7,853,429, to provide more accurate and reliable information about wafer edge surface features.

The method disclosed in U.S. Pat. No. 7,853,429 utilizes the second derivative of the front and back surface, and thickness profile, generally termed the ZDD profile or curvature profile. ZDD metrics are described in document 4209 of SEMI, which is incorporated herein by reference. When an anomaly such as a bump is present, the ZDD will go from negative (since the baseline curvature in the edge roll off region is negative) to positive.

It has been determined that valuable additional information, particularly regarding local ZDD bumps or local maximum ZDD features in the wafer edge region, can result from taking the first derivative of the ZDD profile, to obtain the ZDDD profile. The ZDD method described in U.S. Pat. No. 7,853,429 is not applicable for cases where the local ZDD peaks are located at negative ZDD regions. In an alternate embodiment, derivatives of orders higher than three may be used to remove the low order surface features for more sensitive feature detection. Disclosed hereinafter is a method for enhancing detection and quantification of features in the wafer edge/wafer roll off regions. Near-edge bump features are characterized by first removing roughness and other high frequency, low amplitude surface features.

Figure 1:
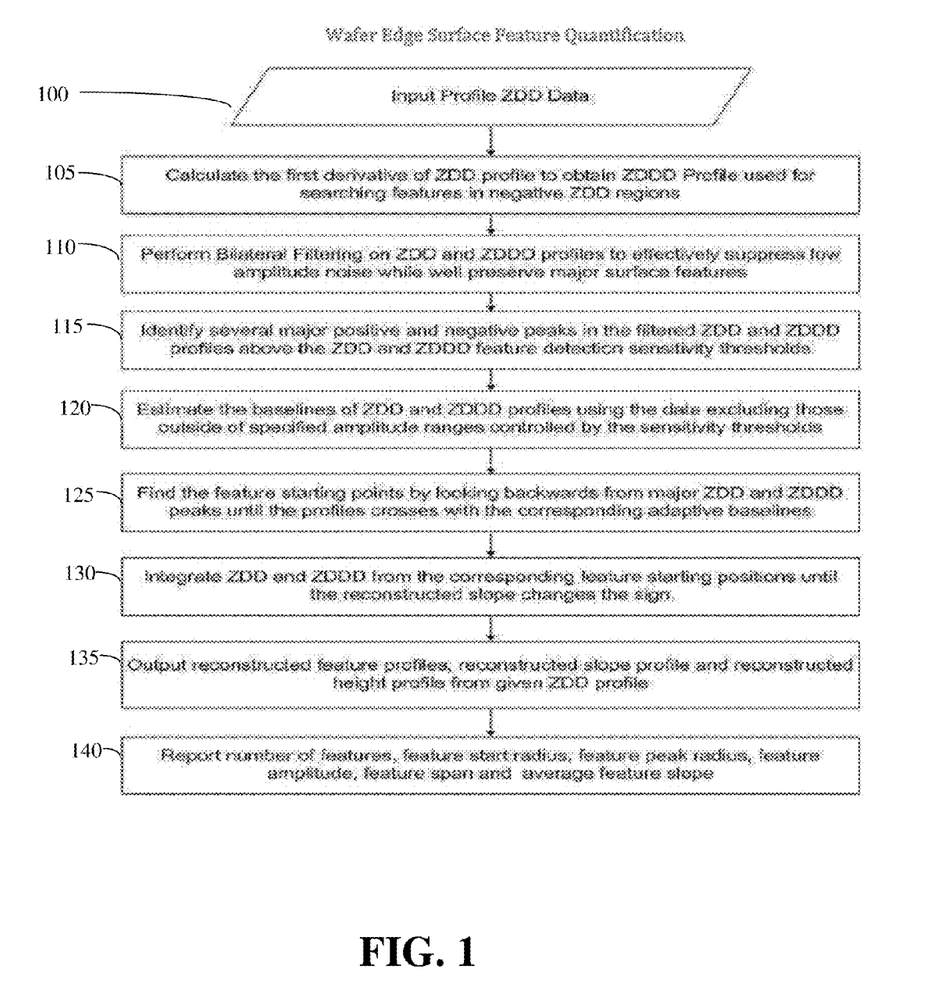
FIG. 1 illustrates a flow diagram for an embodiment of the inventive process.

FIG. 1 illustrates a flow diagram for an embodiment of the inventive process.

Inputs to the process are the ZDD profiles of the wafer surface measurement data, which can include wafer thickness, front and/or back surface shapes. Outputs include information about the wafer surface features in the wafer edge region.

In step 100, the profile ZDD data is input. In an embodiment, wafer surface data Z(x,y) (in Cartesian format) is acquired using the WaferSight tool. Data may be embodied by detected signal levels per pixel, or it may be considered in a more general form as discrete data arrays which may be one-dimensional or two-dimensional. Z(x,y) is then used to calculate radial profile Z(r,θ). Curvature profile ZDD(r,θ) is obtained from the radial profile by differentiating twice. Note that here the derivative operation is performed only on r, and that theta is held fixed:

$$ZDD(r,\theta) = d^2/dr^2 Z(r,\theta)$$

Figure 2:
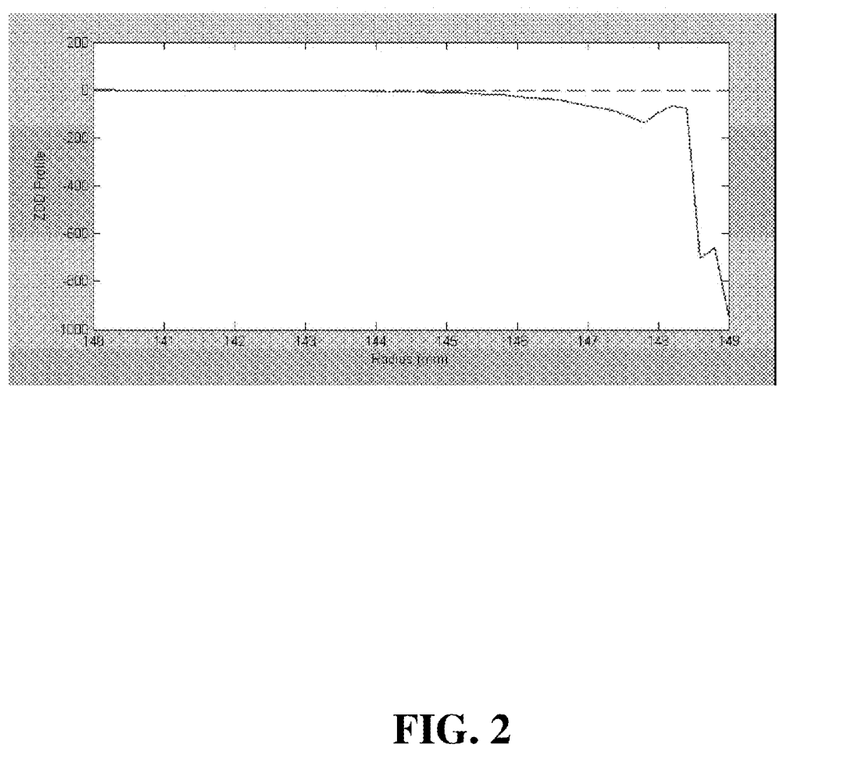
FIG. 2 shows examples of positive and negative ZDD features.

In the ZDD method described in U.S. Pat. No. 7,853,429, the ZDD profile is used to directly determine the wafer bump starting and peak radius positions in the edge roll off region, and then to calculate the bump amplitude and slope information. The transition from negative ZDD value to positive ZDD value is used to trigger the construction of the bump profile from the ZDD profile. This method is applicable to the bumps represented by positive ZDD values. However, it is not applicable to bumps in negative ZDD regions. FIG. 2 illustrates bump features in the negative ZDD regions. Disclosed hereinafter is processing of the ZDD profile to extract surface features of interest in negative ZDD portions of the wafer edge/wafer roll off region.

In step 105, an additional differential operation is performed on the ZDD profile to obtain a ZDDD profile, $$ZDDD(r,\theta) = d/dr\, ZDD(r,\theta) = d^3/dr^3 Z(r,\theta)$$

Figure 3:
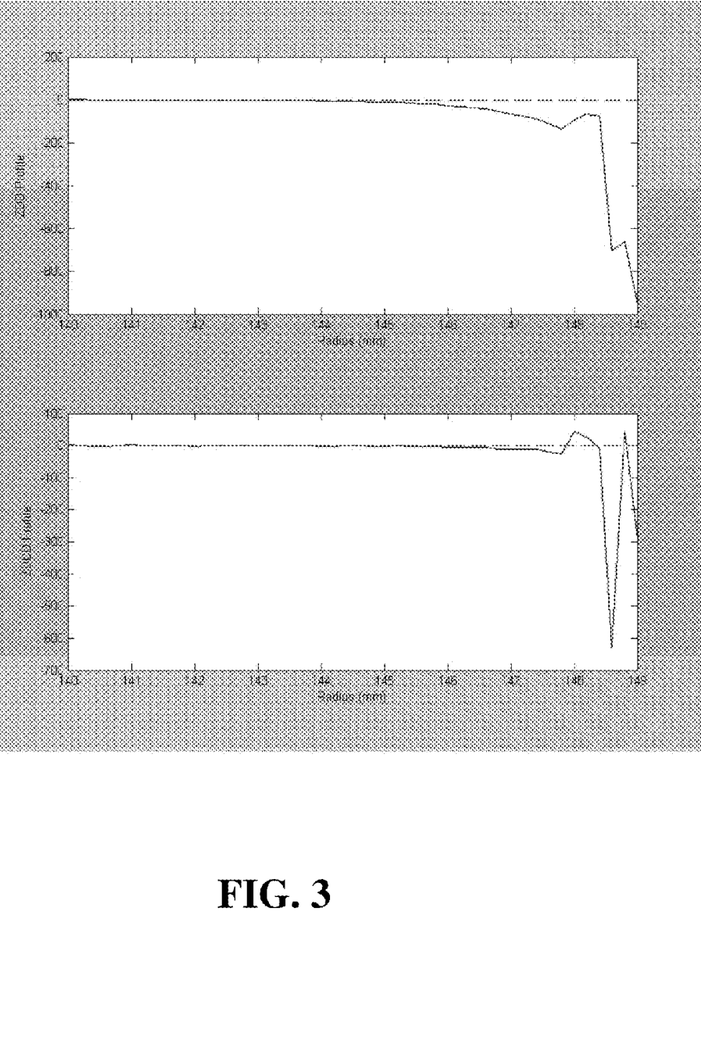
FIG. 3 shows an exemplary ZDD curve and the corresponding ZDDD curve.

FIG. 3 shows an exemplary ZDD curve and the corresponding ZDDD curve. Note that in the ZDDD curve very high amplitude and sharp features occur in the negative ZDD region. Also note that the approximate errors in the digital calculation of the differential operation are determined by the wafer surface smoothness and the data sampling distance.

Performing the ZDDD operation on the Z(r, θ) profile has the effect of removing the local low order terms to obtain the magnitude of the higher order edge bumps. This can be more clearly seen from the polynomial expansion of Z(r, θ) in terms of r:

$Z(r) = a_0 + a_1 r + a_2 r^2 + O(r)$, where $O(r)$ is the terms of orders 3 or higher. When the third derivative is taken of Z(r), the first three terms become zero, and only the signal components in the third or higher order of r remain.

In step 110, perform bilateral filtering on the ZDD and ZDDD profiles, to effectively suppress low amplitude noise, while preserving the major surface features.

In an existing technique for suppressing noise, the wafer surface may be divided into sectors, and the wafer surface profile Z(r, θ) is calculated by averaging the data in the sector range [θ−Δ, θ+Δ]. A smaller number of sectors, 16 for example, incorporates a larger amount of data into each average. As a result, high frequency noise components will be averaged out to a greater extent in the calculated profile. However, the averaging process will reduce the surface feature signal, and will therefore lower the angular resolution of the surface feature detection. In contrast, using a larger number of sectors, 360 for example, will provide good angular resolution for the surface features. However, in this case, the profile signal will be much noisier due to less data being averaged, especially at the wafer edge region, and this will affect the reliability of feature detection and quantification. Various filtering schemes have been introduced, including simple averaging filtering or Gaussian filtering, both of which involve using the weighted average of neighboring pixels or neighboring data values in the discrete data array. These filtering schemes will damage the ZDD feature signals when suppressing profile noise.

A technique is introduced hereinafter, known as bilateral filtering. Bilateral filtering effectively suppresses low amplitude surface background noise components, while preserving important surface feature signals. It contributes to consistency of feature detection and quanification. Instead of just using the weighted average of the neighboring pixels or array data values, as is done in simple average filtering or Gaussian filtering, the bilateral filter also uses the discrete data value information in the filtering process, by replacing an array point's value in the filter output by a weighted average of its neighboring data points, controlled by both the data sample distance in space, and data value range information. The bilateral filter, as defined in Equation 1 below, calculates the filtered profile data $P_f(r)$ from the original surface profile $P(r)$, where $P(r)$ can be $ZDD(r)$ or $ZDDD(r)$.

$$P_f(r) = \frac{1}{W} \sum_{i=r-M}^{i=r+M} \exp\left(-\frac{(i-r)^2}{(T_s)^2}\right) \exp\left(-\frac{(P(i)-P(r))^2}{(T_r)^2}\right) P(i) \quad (1)$$

As described in step 110 of the flow diagram, in the disclosed method the bilateral filtering is applied to the ZDD and ZDDD profiles directly, rather than to the Z(r) profile. The form of the filtering equations is the same. Two control parameters, $T_s$ and $T_r$, may be set by the user, based on the noise level of the height profile, and the sensitivity of feature detection. These control parameters may be used to adjust the signal contribution from the neighboring data samples. A larger spatial parameter $T_s$ allows greater contribution to the filtered output profile from neighboring pixels at a greater spatial distance from the filter center. In an embodiment, the spatial parameter is determined by the filter length parameter M, which is the number of data samples used in the filtering. $T_r$ is the product of the ZDD feature detection threshold (set by the user) and the profile noise level (determined by the processor). The filtering is controlled by the feature detection sensitivity setting, and is carried out adaptively based on the estimated profile noise level. A larger range parameter $T_r$ allows greater contribution from data samples at a greater signal range from the filter center data sample signal value. The normalization factor W is determined as follows in Equation 2:

$$W = \sum_{i=r-M}^{i=r+m} \exp\left(-\frac{(i-r)^2}{(T_s)^2}\right) \exp\left(-\frac{(P(i)-P(r))^2}{(T_r)^2}\right) \quad (2)$$

Figure 4:
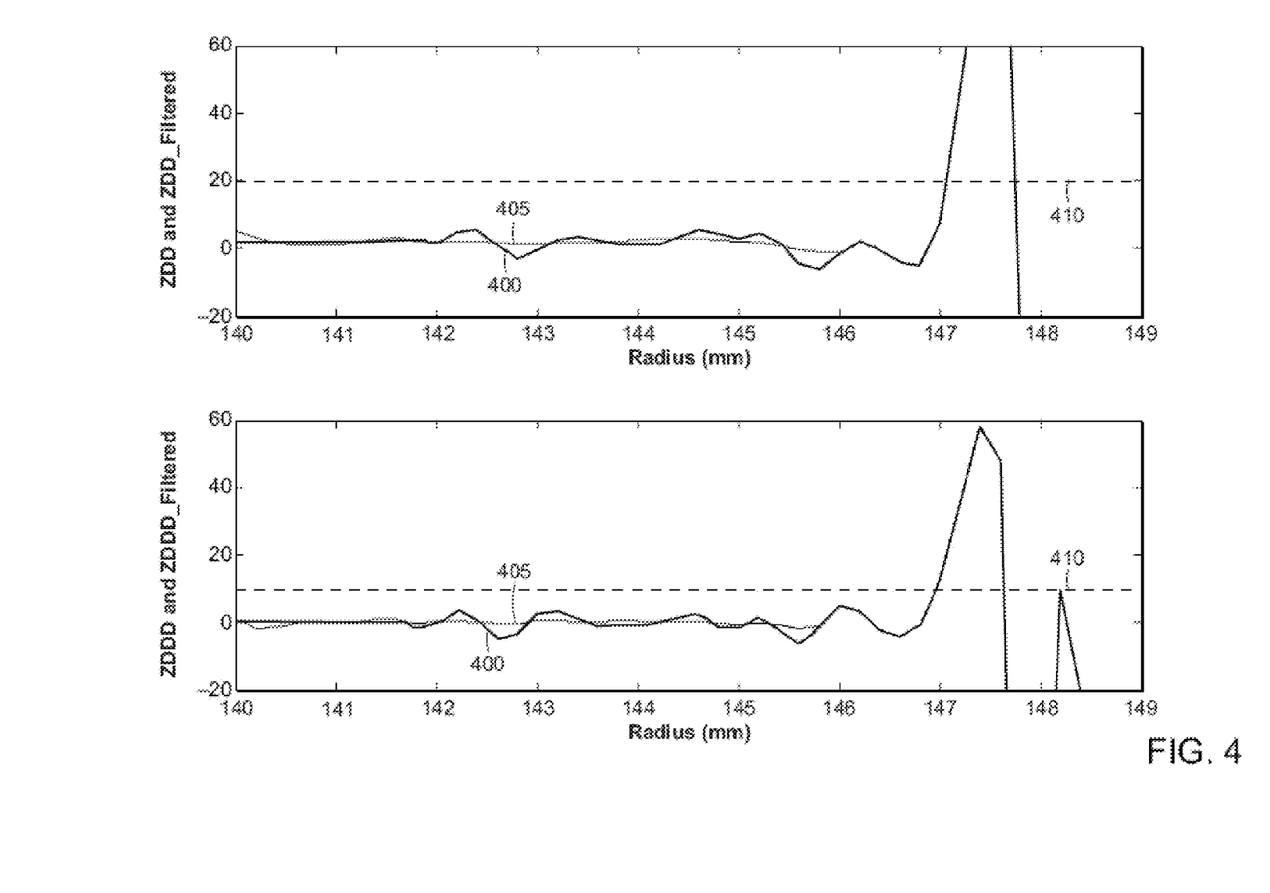
FIG. 4 illustrates ZDD and ZDDD profiles which have had bilateral filtering applied to them.

FIG. 4 illustrates ZDD and ZDDD profiles which have had bilateral filtering applied to them. These are termed filtered ZDD and ZDDD profiles. In the figure, lines 400 denote the original, unfiltered profiles, and lines 405 denote the filtered profiles. It is clear that the noise components, i.e. components below the indicated horizontal noise threshold lines 410, are effectively reduced by the bilateral filtering, whereas the big feature signals, i.e. signals above the noise threshold lines, are well preserved after the bilateral filtering. These aspects of the bilateral filtering will help in major feature peak identification and accurate and reliable feature starting radius determination.

In step 115, identify several major positive and negative peaks in the filtered ZDD and ZDDD profiles above the ZDD and ZDDD feature detection sensitivity thresholds. Positive peaks refer herein to peaks in a region where the profile values are greater than zero in the corresponding ZDD and ZDDD domains, negative peaks are in a region where the profile values are less than zero. These feature detection sensitivity thresholds are user-determined so that only ZDD/ZDDD peaks higher than these thresholds will trigger feature detection.

In the method disclosed in U.S. Pat. No. 7,853,429, crossing points from negative ZDD to positive ZDD are used to trigger reconstruction of edge feature profiles. However, small ZDD peaks, some of which may be due to background noise, will generate construction of many features with low amplitudes and short duration. Only features greater than a certain magnitude, i.e., features which will affect product yield, are generally of interest. Features below that magnitude, whether real or measurement noise-generated, are treated as noise.

Figure 5:
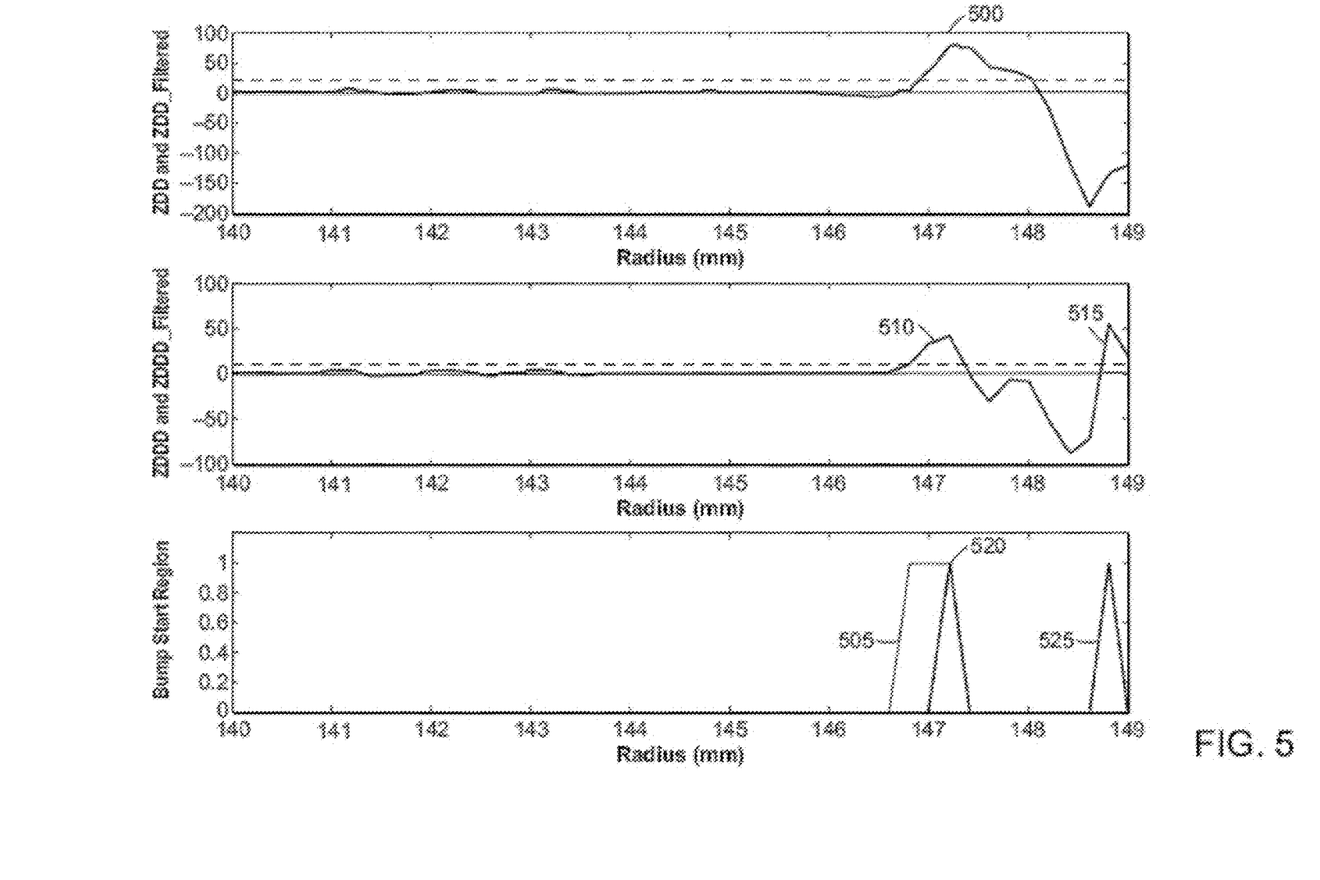
FIG. 5 illustrates the detection of features according to the improved wafer edge feature quantification package disclosed herein.

FIG. 5 illustrates the detection of features according to the improved wafer edge feature quantification package disclosed herein. Peak 500 in the filtered ZDD profile corresponds to bump start region 505; peaks 510 and 515 in the filtered ZDDD profile correspond to bump start regions 520 and 525. Only peaks in the ZDD and ZDDD profiles which extend into the positive value region, above the detection sensitivity thresholds, correspond to edge features. And it is only in these peak regions where feature profile reconstruction, including searching for starting feature positions, will be calculated.

Figure 6:
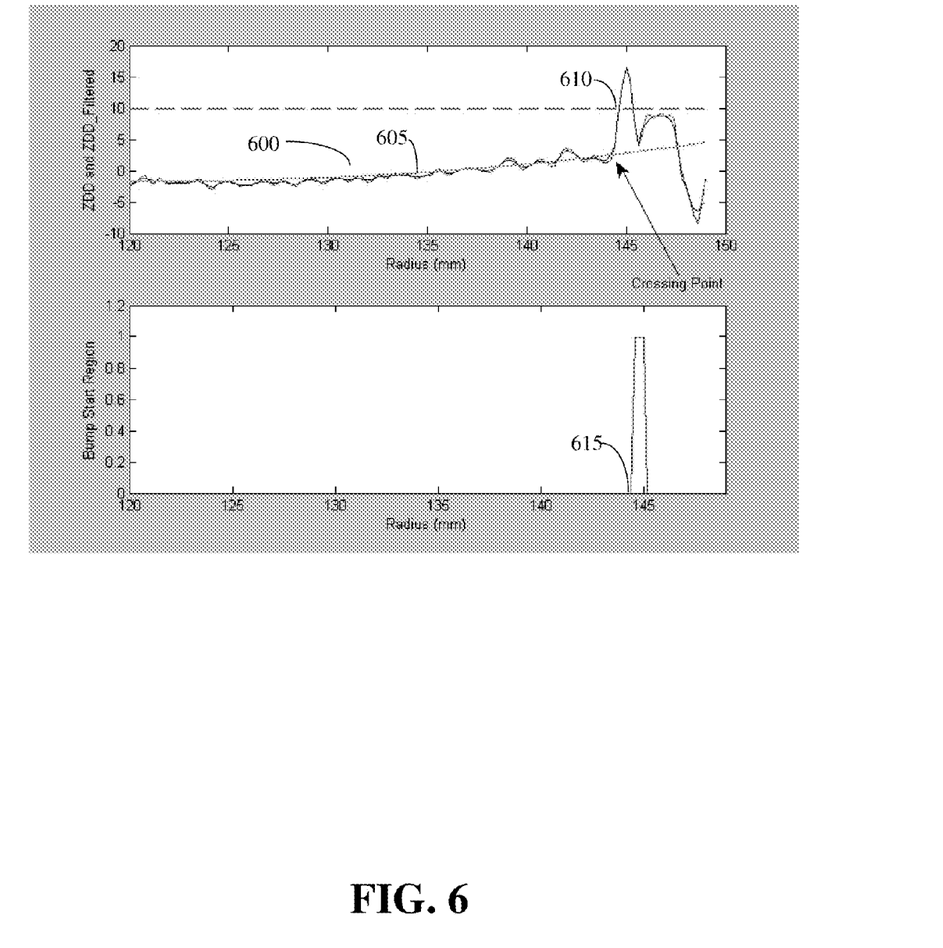
FIG. 6 illustrates a global baseline trend and the determination of the crossing point for edge bump detection.

In step 120, estimate the baselines of the ZDD and ZDDD profiles using the data excluding those outside of specified amplitude ranges controlled by the sensitivity thresholds. In other words, adaptive baseline determination is achieved with a truncated profile fitting controlled by the ZDD/ZDDD thresholds for feature detection sensitivity. The baseline is truncated at the onset of features above the feature detection threshold. The baselines obtained will have a closer match with the true ZDD/ZDDD baselines after removal of both the high magnitude components, i.e. features and big edge roll off parts in the edge profile, and after removal of background noise. (achieved by the bilateral filtering) In order to accurately determine bump feature starting point radius, it may be desirable to remove any global surface trends in the ZDD or ZDDD profiles. Such a situation is illustrated in FIG. 6, where baseline 600 trends upwards. To reduce the negative effect of ZDD and ZDDD trends on the bump starting radius point, the ZDD and ZDDD profile data in the range [−Ts≤Pr≤Ts], specified by the feature detection thresholds, are fitted to a polynomial. This is a trimmed data fitting which only is applied to the profile background signals below the set detection threshold. It therefore avoids directly fitting the data samples at the feature bumps when performing the baseline compensation, thereby avoiding attenuation of the feature signals. Bold line 605 is an exemplary result of baseline fitting.

In step 125, find the feature starting positions by looking backwards from the major ZDD and ZDDD peaks until the profile crosses the corresponding adaptive baseline. The feature bump starting radius positions can be determined by starting from the identified major peak regions and searching the corresponding crossing points of ZDD and ZDDD profiles with the estimated baselines. As a result, the ZDD and ZDDD baseline trends are automatically compensated and the feature starting radius positions can be accurately and reliably determined. As an example, crossing point 610 denotes feature starting radius 615.

In step 130, integrate the ZDD and ZDDD profiles beginning at the corresponding feature starting positions, and ending where the reconstructed slope changes sign. After the feature starting positions are determined in step 125, the wafer surface feature profiles can be reconstructed from the ZDD and ZDDD profiles. If the feature starting positions have been determined from the ZDD profile, the feature slope profile $S_b(r)$ can be calculated with a single integration as follows:

$$S_b(r) = \int_{BSR}^{r} ZDD(\rho)d\rho \qquad (3)$$

and the feature height profile $H_b(r)$ can be calculated with a second integration as follows:

$$H_b(r) = \int_{BSR}^{r} S_b(\rho)d\rho, \qquad (4)$$

where BSR is the bump start radius.

If the feature starting radius positions have been determined from the ZDDD profile, the ZDD profile needs to be first reconstructed from the ZDDD profile with an additional integration as follows:

$$ZDD(r) = \int_{BSR}^{r} ZDDD(\rho)d\rho | \qquad (5)$$

Note that the integration is carried out only until the feature slope profile changes sign, i.e., for a bump feature, until the slope becomes negative. The integration up to the peak provides the magnitude of the bump, which is the parameter of interest. The endpoint for the integration is dynamically determined during the integration process, and therefore is data dependent, i.e., has no fixed value in the equation. In an embodiment, for a numerical computation of these integral functions, the integration for calculating the slope from ZDD may be implemented as a summation of discrete data samples, using the Runge-Kutta method. The other integrations can be similarly computed.

The Runge-Kutta method is defined as $$S_b(r) = S_b(r-1) + (ZDD(r-1) + ZDD(r))\Delta/2 | \qquad (6)$$

where $\Delta$ is the distance between discrete data samples.

Figure 7:
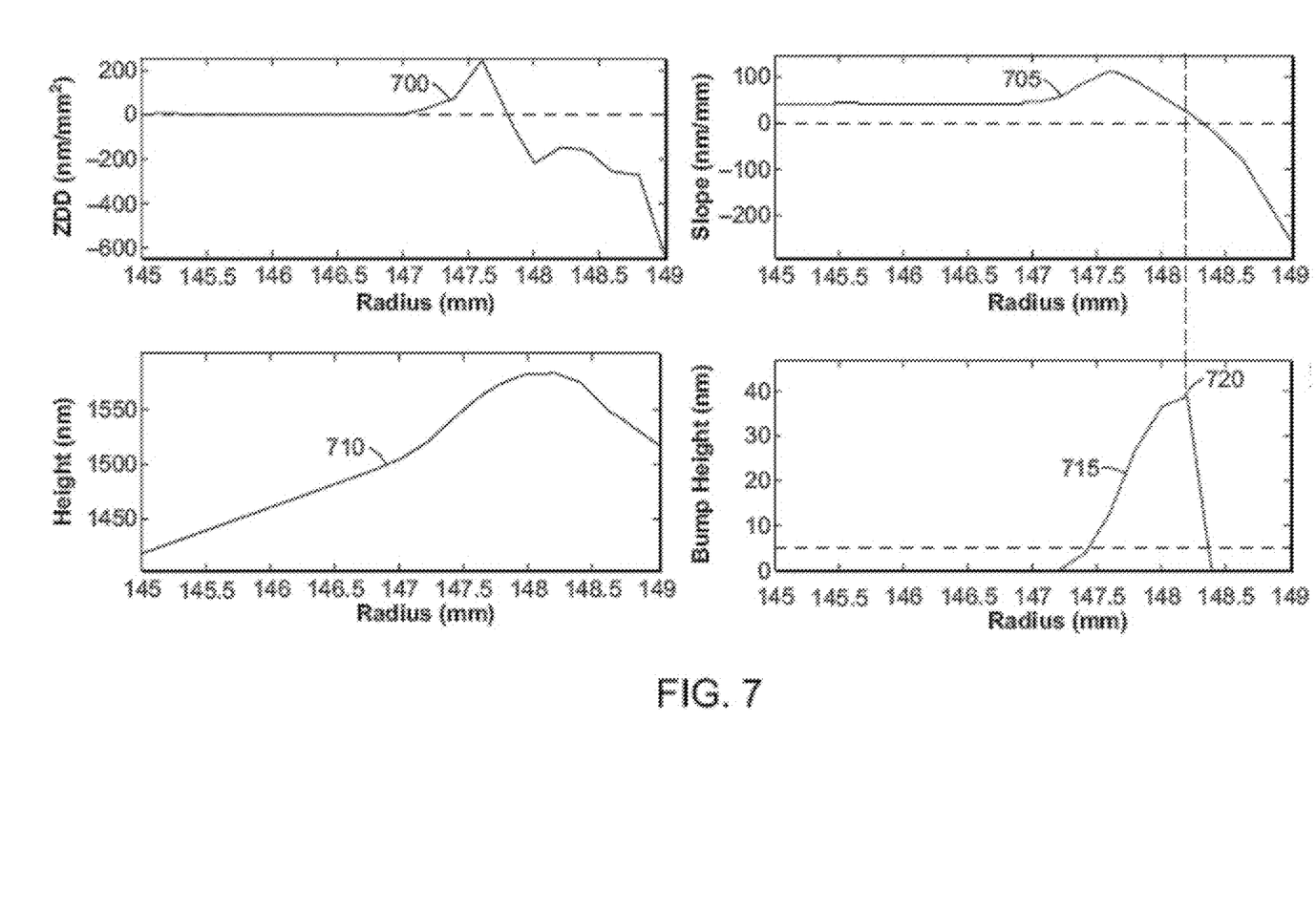
FIG. 7 illustrates a first exemplary reconstructed bump feature profile obtained using the above bump reconstruction equations.

In step 135, output the reconstructed feature profiles, reconstructed slope profile, and reconstructed height profile from the given ZDD profile and, if applicable, the ZDDD profile. Any reconstruction from a ZDDD profile contains only components of third order or higher. FIG. 7 illustrates a first exemplary reconstructed bump feature profile obtained using the above bump reconstruction equations. Curve 700 is the ZDD profile, curve 705 is the normalized slope profile, curve 710 is the normalized height profile, and curve 715 is the bump height profile. These profiles provide detailed information about the bump start radius (BSR), bump peak radius (BPR), and the bump height.

Figure 8:
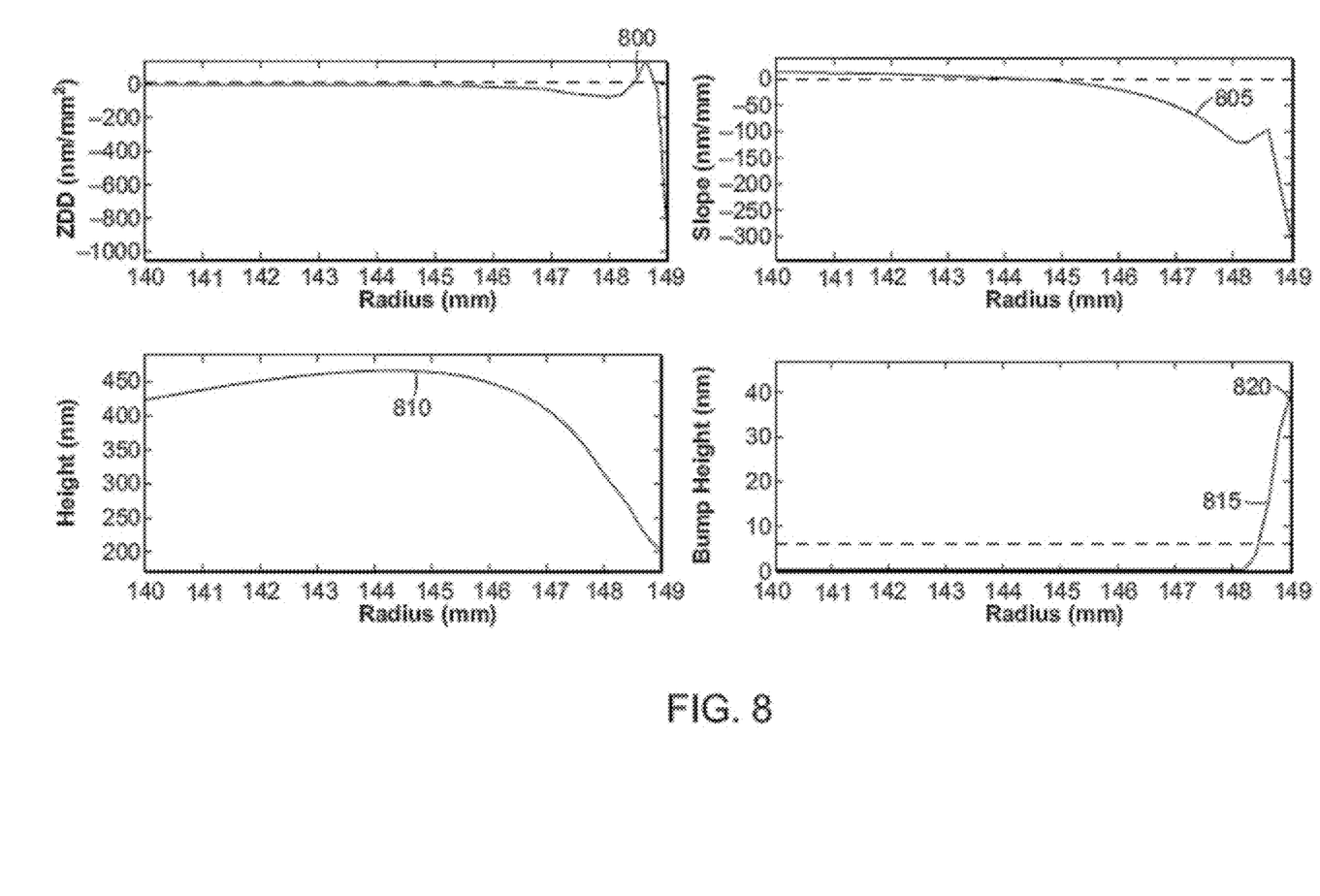
FIG. 8 illustrates a second exemplary reconstructed bump feature profile obtained using the above bump reconstruction equations.

FIG. 8 illustrates a second exemplary reconstructed bump feature profile obtained using the above bump reconstruction equations. Curve 800 is the ZDD profile, curve 805 is the normalized slope profile, curve 810 is the normalized height profile, and curve 815 is the bump height profile.

It can be observed that the normalized slope profile in FIG. 7 has a positive value at the bump peak position 720, while the normalized slope profile has a negative value at the bump peak position 820 in FIG. 8. From these two profile sets, it can also be seen that the peaks 720, 820 of the reconstructed bumps are not at the same positions as peaks in the slope or ZDD profiles. According to the earlier method in U.S. Pat. No. 7,853,429, the ZDD profile is used to directly determine the wafer bump starting and peak radius positions in the edge roll off region, and then to calculate the bump amplitude and slope information. However, as seen by the above figures, the improved method disclosed herein provides more accurate peak position information. Additionally, since the method of U.S. Pat. No. 7,209,857 requires a positive slope region to identify and characterize a bump feature, this method will not be applicable to a peak in the negative slope region as in FIG. 8.

Figure 9:
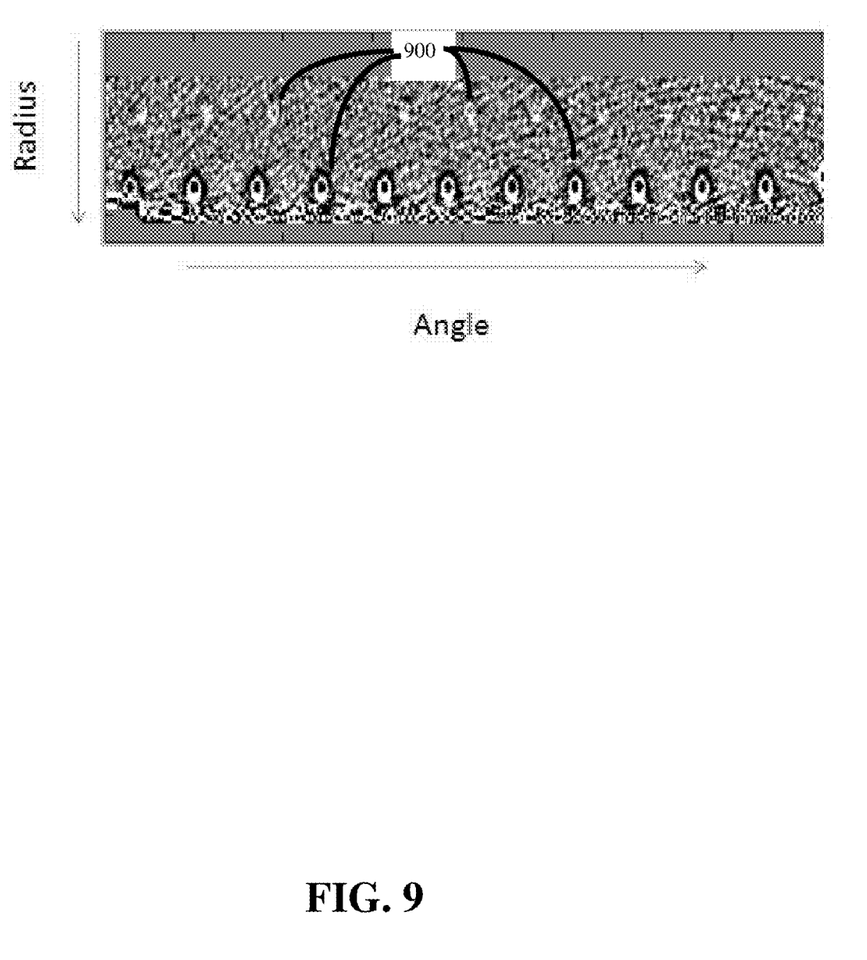
FIG. 9 shows an edge sector including near edge epi features.

The algorithm improvement and expansion as disclosed herein has been implemented using Matlab. It has more recently been implemented using C++ for WaferSight. Using these packages, users can process the front and back wafer surface shape data, or the wafer thickness data. The radius range for the bump feature search can be selected. The bump feature detection sensitivity can by controlled by the ZDD threshold and the bump amplitude threshold. In an embodiment, the bump reconstruction process will only be carried out when the ZDD and the ZDDD peak values are higher than the user-selected ZDD and ZDDD thresholds. The user can choose to detect only the bump with the maximum amplitude, or all major bumps in the input profile. The wafer edge surface bumps with amplitudes higher than the bump height threshold will be detected, and detailed information about the bump may be reported (see step 140). This information can be used to report the process quality, quantify the wafer roll off region, and may also be used for qualification of the wafer. The reported information may include:

1. Types of edge bumps, i.e., bumps in the positive ZDD region [referred to herein as Type 1 bumps, and bumps in the negative ZDD region, referred to herein as Type 2 bumps;
2. The number and distribution of edge bumps of each type. Multiple bump detection and quantification is enabled in the radial search region. The method enables differentiating and quantifying both Type 1 and Type 2 bumps.
3. The bump properties, such as bump starting position, bump span, bump magnitude and bump average slope, defined as bump magnitude divided by bump span.
4. Edge region radial roughness can be accurately quantified. Subtraction of the bilateral filtered profile signal from the original profile signal will generate accurate edge region radial roughness without interference from high magnitude edge features. The roughness can be described using standard statistics such as RMS or Power Spectrum Density (PSD) functions. The profile derived from the roughness is evidenced as low magnitude, high frequency noise components. Surface noise suppression schemes can be used in accurate quantification of edge region radial roughness.
5. The data reporting herein has been for a fixed angle, but for varying radius. The method could be expanded to explore data at a constant radius but varying angle. This could yield circumferential edge quantification in height, slope, curvature, or higher order differential domains. An example of this is illustrated in FIG. 9, which shows an edge sector including EPI defects 900. In this figure, the x-axis is the angle, the y-axis is radius, and the wafer edge properties in the angular direction can be evaluated and reported.

The algorithms disclosed herein can be easily extended and modified for detection and quantification of wafer edge surface dimples. The wafer surface profiles can be vertically flipped so as to map negative valleys into positive peaks. The algorithms can be then used to detect and quantify the dimple features. Some modifications in the algorithm settings may be required to achieve optimum performance for dimple feature application.

System Considerations

The inventive methods or portions thereof may be computer-implemented. The computer system, illustrated in FIG. 10, may include a processor 1000 (e.g. a processor core, a microprocessor, a computing device, etc), memory 1005 which may include a main memory 1007 and a static memory 1008, which communicate with each other via a bus 1010. The machine may further include a display unit 1015 that may comprise a touch-screen, or a liquid crystal display (LCD), or a light emitting diode (LED) display, or a cathode ray tube (CRT). As shown, the computer system also may include a human input/output (I/O) device 1020 (e.g. a keyboard, an alphanumeric keypad, etc), a pointing device 1025 (e.g. a mouse, a touch screen, etc), a drive unit 1030 (e.g. a disk drive unit, a CD/DVD drive, a tangible computer readable removable media drive, an SSD storage device, etc), a signal generation device 1035 (e.g. a speaker, an audio output, etc), and a network interface device 1040 (e.g. an Ethernet interface, a wired network interface, a wireless network interface, a propagated signal interface, etc).

Figure 10:
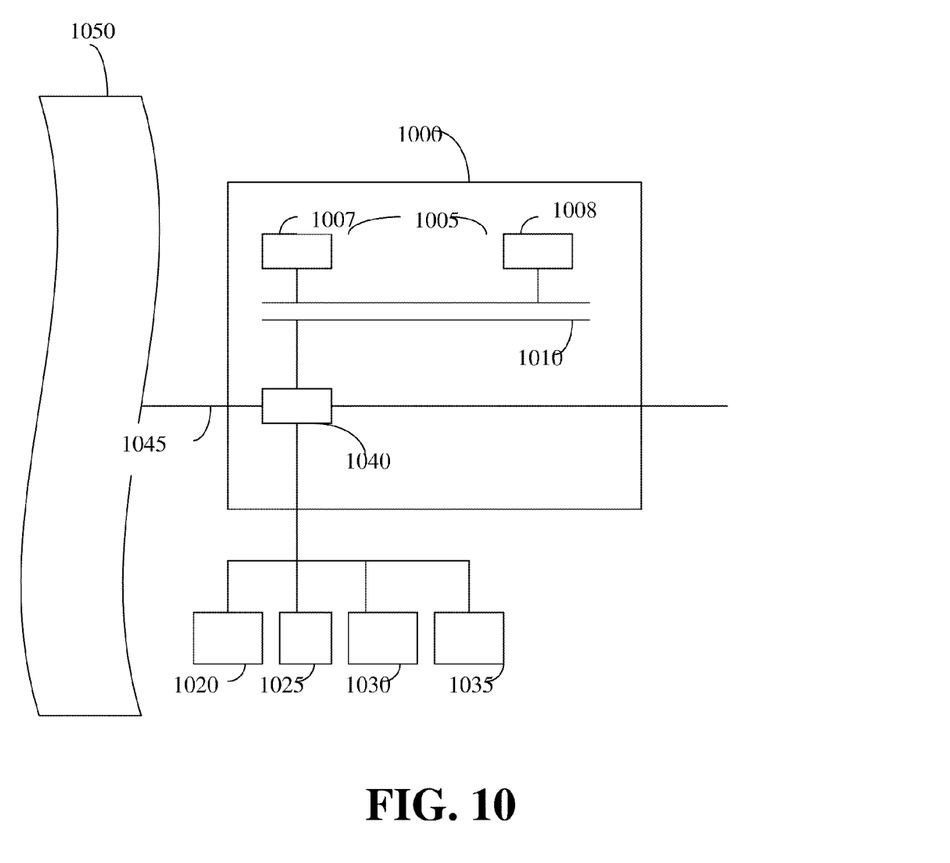
FIG. 10 illustrates an exemplary computer system that may be used to implement portions of the inventive methods.

The drive unit 1030 may include a machine-readable medium on which is stored a set of instructions (i.e. software, firmware, middleware, etc) embodying any one, or all, of the methodologies described above. The set of instructions is also shown to reside, completely or at least partially, within the main memory 1007 and/or within the processor 1000. The set of instructions may further be transmitted or received via the network interface device 1040 over the network bus 1045 to network 1050.

It is to be understood that embodiments of this invention may be used as, or to support, a set of instructions executed upon some form of processing core (such as the CPU of a computer) or otherwise implemented or realized upon or within a machine- or computer-readable medium. A machine-readable medium includes any mechanism for storing or transmitting information in a form readable by a machine (e.g. a computer). For example, a machine-readable medium includes read-only memory (ROM); random access memory (RAM); magnetic disk storage media; optical storage media; flash memory devices; electrical, optical, acoustical or other form of propagated signals (e.g. carrier waves, infrared signals, digital signals, etc); or any other type of media suitable for storing or transmitting information.

It is not expected that the present invention be limited to the exact embodiments disclosed herein. Those skilled in the art will recognize that changes or modifications may be made without departing from the inventive concept. By way of example, an alternative method for detecting surface bumps in the wafer edge region which does not use the ZDDD profile comprises:
   a) identify the local ZDD maxima and minima;
   b) check the range from the local minimum to the neighboring local maximum;
   c) if the range is higher than the ZDD range threshold, integrate ZDD(r) twice from the local minimum to the local maximum to obtain the bump magnitude of the edge bump.

Note that this alternate scheme works for both positive and negative ZDD(r) regions. The scope of the invention should be construed in view of the claims.

The invention claimed is:

1. A method utilizing a processor included in a computer system for characterizing an anomaly feature on a wafer, the method comprising the steps of:
   obtaining wafer surface measurement data yielding radial profile $Z(r, \theta)$ of sensed height information, within at least a sector in the near edge region of the wafer (edge roll off region);
   determining radial profile $Z(r, \theta)$ of sensed height information for the wafer along at least a radial line within the sector;
   obtaining a ZDD profile $ZDD(r,\theta)=d^2/dr^2 Z(r,\theta)$, the second derivative curve of radial profile $Z(r, \theta)$ of sensed height information, and a ZDDD profile $ZDDD(r,\theta)=d/dr\ ZDD(r, \theta)=d^3/dr^3 Z(r,\theta)$;
   processing the ZDD profile and the ZDDD profile to produce a slope profile;
   determining an anomaly span metric from the slope profile;
   processing the ZDD profile and the ZDDD profile to produce a height profile; and
   determining an anomaly height metric from the height profile.

2. The method of claim 1, wherein said anomaly is a bump in an edge roll off region of said wafer.

3. The method of claim 2, wherein said bump is positioned in a negative region of said ZDD profile.

4. The method of claim 2, further including the steps of:
   calculating a filtered ZDD profile and a filtered ZDDD profile using bilateral filtering.

5. The method of claim 4, wherein filtering from said bilateral filtering is controlled by:
   feature detection sensitivity; and
   estimated profile noise level.

6. The method of claim 2, further including the step of adaptively determining baselines of said ZDD and ZDDD profiles using a truncated profile fitting controlled by the ZDD/ZDDD thresholds for feature detection sensitivity.

7. The method of claim 6, wherein said step of processing the ZDD profile and the ZDDD profile to produce a height profile includes:
   finding anomaly feature starting positions by looking backwards from major ZDD and ZDDD peaks until the ZDD and ZDDD profiles cross a corresponding adaptive baseline.

8. The method of claim 7, further including the steps of reconstructing anomaly feature height profiles by integrating the ZDD and ZDDD profiles beginning at the corresponding anomaly feature starting positions, and ending where reconstructed slope changes sign.

9. The method of claim 1, further including detection and quantification of multiple bumps in a radial search region.

10. The method of claim 1, further including the steps of calculating normalized height, slope, and curvature profiles, with only signal components in third or higher order of r remaining, from said ZDDD profile.

11. The method of claim 5, further including the step of quantifying edge region radial roughness using Root Mean Square (RMS) or Power Spectral Density (PSD) statistics after removing bump feature and edge roll off signal components in the profiles by use of bilateral filtering.

12. The method of claim 2, further comprising the step of reporting and quantifying the wafer edge roll off region including:
   number of edge bumps of type 1 (positive ZDD peak) and type 2 (negative ZDD peak);
   for each edge bump, properties including: bump start position, bump span, bump magnitude, and bump average slope.

13. The method of claim 2, further including the step of quantifying data at a constant radius but varying angle, to yield circumferential edge quantification in height, slope, curvature, or higher order differential domains.

14. A system for characterizing an anomaly feature on a wafer, said system including:
   a processor programmed to perform the steps of:
   (a) obtaining wafer surface measurement data yielding radial profile $Z(r, \theta)$ of sensed height information, within at least a sector in the near edge region of the wafer (edge roll off region);
   (b) determining radial profile $Z(r, \theta)$ of sensed height information for the wafer along at least a radial line within the sector;
   (c) obtaining a ZDD profile $ZDD(r,\theta)=d^2/dr^2 Z(r,\theta)$, the second derivative curve of radial profile $Z(r, \theta)$ of sensed height information, and a ZDDD profile $ZDDD(r,\theta)=d/dr\ ZDD(r, \theta)=d^3/dr^3 Z(r,\theta)$;
   (d) processing the ZDD profile and the ZDDD profile to produce a slope profile;
   (e) determining an anomaly span metric from the slope profile;
   (f) processing the ZDD profile and the ZDDD profile to produce a height profile; and
   (g) determining an anomaly height metric from the height profile.

* * * * *